Nov. 12, 1968 TAKASHI TOKUYAMA ET AL 3,410,736

METHOD OF FORMING A GLASS COATING ON SEMICONDUCTORS

Filed March 3, 1965

INVENTORS
Takashi Tokuyama
Keijiro Uehara
Yuko Adachi

K. Edward Mesterm, Agt.

3,410,736

METHOD OF FORMING A GLASS COATING ON SEMICONDUCTORS

Takashi Tokuyama, Kitatama-gun, Tokyo-to, Keijiro Uehara, Kita-ku, Tokyo-to, and Yuko Adachi, Hachioji-shi, Tokyo-to, Japan, assignors to Kabushiki Kaisha Hitachi Seisakusho, Tokyo-to, Japan, a joint-stock company of Japan Filed Mar. 3, 1965, Ser. No. 436,801
Claims priority, application Japan, Mar. 7, 1964, 39/12,637; Sept. 1, 1964, 39/49,496
17 Claims. (Cl. 148—186)

ABSTRACT OF THE DISCLOSURE

A method of fabricating semiconductor devices protected with an insulating covering, wherein a silicon dioxide layer is formed on the surface of a semiconductor substrate, and a lead oxide layer is deposited on the silicon dioxide layer from the vapor phase; whereafter the whole device is heated at approximately 600° C. in an oxidizing atmosphere to form a passivating film on the substrate surface consisting essentially of silicon dioxide and lead oxide.

Figure 1A:
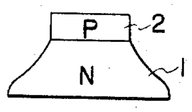

This invention relates to surface treatment for semiconductor devices, and more particularly it relates to a new method for forming insulating protective films on the surfaces of semiconductors such as silicon, germanium, and compound semiconductors.

It is a general practice to protect with an insulating covering the surfaces, particularly the exposed parts of pn junctions, of semiconductors of semiconductor devices such as transistors and diodes in order to increase their serviceable life and reliability and to reduce noise.

For this insulating covering, it is known to use a layer of silicon dioxide $SiO_2$ thermally grown from the surface of silicon Si. However, because the growing temperature for such a $SiO_2$ layer is a high temperature of from 1,000 to 1,200 degrees C., the active impurities which have been introduced into the Si substrate prior to this growth of $SiO_2$ layer rediffuse during the $SiO_2$ layer growth, and the position of each pn junction is displaced. This result imposes difficulties in the design of micron order semiconductor devices.

Furthermore, since the oxide layer is formed at the temperature at which diffusion of the active impurities occurs, and also the diffusion coefficients and segregation coefficients relative to the active impurities in the respective layers of the Si and $SiO_2$ differ, as a result, the impurity concentration of the semiconductor surface in the vicinity of the junction surface varies, and there arises a state whereby carrier accumulation, that is, the so-called enhancement mode, occurs, or a state whereby a lack of carrier, that is, the so-called depletion mode, occurs. This result causes the inversion, for example, of a p-type semiconductor surface covered by the $SiO_2$ layer into an n-type surface and is considered to be one cause of increase in the surface leakage current of semiconductor devices.

The deposition of $SiO_2$ on a semiconductor surface by pyrolytic decomposition of organo-oxysilane has also been proposed. For example, when tetraethoxysilane $Si(OC_2H_5)_4$ is introduced with $N_2$ gas as a carrier gas to the surface of a substrate to be coated and maintained at 725 degrees C. for 30 minutes, an $SiO_2$ film of approximately 4,000 angstroms is obtained. Since an $SiO_2$ film can be obtained at a relatively low temperature by this method, the disadvantage of rediffusion of the impurities during the formation of the $SiO_2$ film is eliminated. However, the $SiO_2$ film so obtained heretofore has been porous and has not had sufficient effect in shielding the semiconductor surface from impurities and moisture contained in the atmosphere.

Furthermore, in general $SiO_2$ has the tendency to affect the surface potential of a semiconductor surface covered thereby and to render the surface into one of n-type conductivity and is considered to be a cause of deterioration of the breakdown voltage of the element.

It is further known that when a semiconductor is heated in an atmosphere containing lead monoxide PbO, a glass-like substance consisting of the oxides of lead and the semiconductor is formed at a temperature in the range of approximately from 500 to 600 degrees C. This method, however, has been accompanied by difficulty in reproducibility because of the necessity of carrying out control of the quantity of PbO introduced to the semiconductor surface as the vapor pressure of the PbO contained in the carrier gas is measured.

Still another known method is that of depositing lead by evaporation on the semiconductor surface and oxidizing this semiconductor with deposited lead in an atmosphere containing oxygen, whereby the semiconductor oxidizes at a relatively low temperature, and, at the same time, a layer of a glass-like substance consisting of a solid solution of the oxides of the semiconductor and the lead is formed on the semiconductor surface. The resulting glass-like layer containing lead is highly effective in protecting the semiconductor surface from moisture and impurities contained in the atmosphere and is highly desirable for stabilizing the semiconductor surface. However, it has not been possible by this method to produce with good reproducibility such glass-like films of uniformly good quality as mentioned above and as will be described hereinafter.

Since a study of the above mentioned method of depositing lead by evaporation on a semiconductor surface and causing oxidation and the defects of this method are useful for a full understanding of the present invention, a further description relating thereto is added hereinbelow.

As an example, a silicon wafer having a surface which has been maintained clean is prepared, and on the surface thereof a lead layer of a thickness of from a number of hundreds of angstroms to 1,000 angstroms is deposited by evaporation. This wafer is then placed in a heating furnace containing an oxygen atmosphere and heated at a rate, for example, of 15 degrees C. per minute up to a temperature of 600 degrees C., being maintained thereafter for 30 minutes at 600 degrees C. In this heat treatment process, when the temperature rises above 300 degrees C., oxidation of the lead begins as follows:

$$2PbO+Si\rightarrow 2PbO$$

Then, the lead functions as a catalyst, and oxygen is supplied to the silicon surface, whereupon the silicon is oxidized as follows:

$$2PbO+Si\rightarrow SiO_2+2Pb$$

The oxidation of the surface of the silicon wafer progresses in this manner, and, at the same time, a glass-like substance consisting of a solid solution of PbO and $SiO_2$ is formed as follows:

$$PbO+SiO_2\rightarrow SiO_2\cdot PbO$$

In the case when, without the use of lead, a silicon surface is oxidized in an atmosphere of only oxygen or an atmosphere of steam, the $SiO_2$ layer formed on the surface suppresses the diffusion of oxygen because of the high bond energy between its atoms. Accordingly, at a low temperature of the order of from 500 to 600 degrees C., the quantity of oxygen diffusing through the $SiO_2$ layer from the atmosphere and reaching the surface of the silicon is small, and the oxidation speed is low. In order to increase the oxidation speed, it is necessary at normal atmospheric pressure to heat the element to a temperature of 1,000 degrees C. or higher to weaken the bond between the atoms of the $SiO_2$ layer and thereby to facilitate the diffusion therethrough of oxygen.

The use of lead as a mediator has the effect of weakening the bond energy between the atoms of the $SiO_2$ layer and thereby facilitating diffusion of the oxygen, whereby the oxidation of the silicon substrate is expedited even at a relatively low temperature of approximately from 500 to 600 degrees C. The $SiO_2$ and PbO formed in this manner undergo a reaction to form a glass-like substance.

However, in the case when the lead, which has a melting point of 327.4 degrees C., is heated above this melting point and is transformed into molten lead, the equilibrium between its adhesive force with respect to the silicon semiconductor substrate and the surface tension of the molten lead is disrupted in the vicinity of 400 degrees C., the surface tension becoming greater, and the molten lead condenses and becomes a discontinuous layer. Since this lead reacts in this coagulated state to form a glass film, the glass film so formed is an irregular film of uneven shape. There have been extreme instances wherein a protective cover was not formed in actual effect on some parts of the silicon surface, whereby the protective effect was deficient, and an element of high reliability could not be obtained. In some instances in the past, the unreacted lead remained in the glass film and caused deterioration of the characteristics of the element.

We have previously proposed (in U.S. patent application Ser. No. 386,017, filed on July 29, 1964, "Surface Treatment for Semiconductor Devices") a method for protecting semiconductor devices which comprises depositing beforehand a thin film of $SiO_2$ on the surface of a semiconductor substrate such as silicon by a technique such as pyrolytic decomposition of an organo-oxysilane, depositing lead on this $SiO_2$ film by a technique such as evaporation deposition, then heating the element in an atmosphere containing oxygen or an organo-oxysilane thereby to transform the lead into lead oxide and, at the same time, to cause reaction between one part of the $SiO_2$ film provided beforehand and the lead oxide, and thereby to form a film of a glass-like mixture substance composed of oxides of silicon and lead, this resulting film providing protection of the interior semiconductor device from the surrounding atomsphere.

This mehtod, by transforming the $SiO_2$ film into a glass-like mixture substance, affords improvement of the moisture resistance of the film and extensive improvement of mechanical properties such as the thermal expansion coefficient of the film, whereby the reliability and serviceable life of the element are greatly improved.

However, we have found through later research that, in the particular case wherein the quantity of the deposited lead is greater than the quantity of the $SiO_2$ film, the reaction from the lead to the lead oxide does not occur uniformly, and the lead gives rise to a phenomenon in which it partially coagulates, whereby it is difficult to produce a glass-like mixture film of uniform composition. We have further discovered that this phenomenon is not only undesirable for the insulative property of the film but is also very detrimental to the stability over a long period of the electrical characteristics of the semiconductor device such as, for example, the breakdown voltage and current amplification factor, which are determined by the state of the surface of the semiconductor existing within the film.

The present invention, in its broader aspects, contemplates improvements to overcome the above described difficulties of the prior art and, in general, provides a new technique wherein, instead of depositing lead by evaporation on the surface of the element to be treated, an oxide layer is first formed on the surface, and then a glass film is formed thereon by a heat treatment.

Furthermore, there has been proposed a method of forming glass film which comprises forming on a semiconductor surface a layer of $SiO_2$ having a thickness of from 1,000 to 30,000 angstroms, providing thereon a glass member containing $SiO_2$, and, at the same time, heating these materials at a melting temperature in the range of from 400 to 1,000 degrees C. to form a glass covering film of a thickness of from 8,000 to 500,000 angstroms. The above glass member used in this method is composed of substances such as, for example, $SiO_2$, PbO, and $B_2O_3$, and consists of particles of a mean size of from 0.1 to 0.7 micron. Accordingly, the glass film so produced is considerably thick, and a thickness of from 20,000 to 50,000 angstroms is considered to be optimum.

In contrast, by the practice of the present invention, only lead oxide is deposited by evaporation, and, differing from the above mentioned glass member, with only the lead oxide a glass substance cannot be formed. Furthermore, the film produced according to the present invention can be formed to have a thickness of 10,000 angstroms or less including the $SiO_2$ layer and the glass film layer, excellent results being obtainable with a thickness of from 6,000 to 8,000 angstroms. Since such a thin film can be obtained, the effect of strain due to a difference between the thermal expansion coefficients of the film and the semiconductor substrate is small. The thinness of the film, moreover, is advantageous also when holes are to be made therein by a technique such as photoengraving.

According to one embodiment of the present invention, by depositing beforehand a $SiO_2$ layer on the surface of a semiconductor wafer by a method such as pyrolytic decomposition of organo-oxysilane, depositing thereon by evaporation a thin film of PbO, and heat treating the resulting element, it is possible to cause only the surface part of the $SiO_2$ film deposited beforehand to react with the PbO to form a glass-like mixture layer. That is, as a result of this treatment, there is produced a semiconductor surface which is covered by a double covering layer consisting of a layer of $SiO_2$ and a glass cover of a solid solution of $SiO_2$ and PbO.

In this embodiment of the invention, since the semiconductor substrate undergoes no change whatsoever and does not oxidize and become a material of the glass covering, the method can be applied to any of various semiconductors such as silicon, germanium, and intermetallic compound semiconductors. The only precaution required is that of noting the temperature throughout the deposition of the $SiO_2$ layer and preventing rediffusion of the active impurities within the semiconductor. For this reason, the treatment temperature in the case where germanium is used as the substrate should be kept below 700 degrees C. In this form of the invention, it is not especially necessary to carry out the heat treatment in an oxidizing atmosphere.

According to another embodiment of the present invention there is provided a method wherein a thin film of PbO is formed directly on the surface of a silicon wafer by the vacuum deposition method, and this silicon wafer is heat treated in an oxidizing atmosphere, thereby to promote the oxidization reaction of the silicon surface of the silicon substrate through the action of the PbO and to cause the formation of silicon dioxide $SiO_2$ on the silicon surface and, at the same time, the formation of silicon dioxide $SiO_2$ on the silicon surface and, at the same time, the formation of a thin glass layer consisting of a solid solution of the $SiO_2$ and the PbO.

According to still another embodiment of the invention there is provided a method which comprises forming beforehand an $SiO_2$ layer on the surface of a silicon wafer, depositing thereon by evaporation a relatively thick layer of PbO, and heat treating the resulting element in an oxidizing atmosphere. It was observed that, by this method, the $SiO_2$ film deposited beforehand on the silicon wafer surface and the PbO react thoroughly and that the surface layer of the substrate silicon immediately below the $SiO_2$ film undergoes an accelerated oxidation because of the presence of PbO to become $SiO_2$ and, together with the initially formed $SiO_2$, reacts with the PbO to form a glass-like mixture substance.

By this embodiment of the invention, since the extreme surface of the underlying silicon oxidizes to become $SiO_2$, this result, in actual effect, is the same as though etching of this part had occurred. Accordingly, by applying this treatment to a semiconductor device having contamination in its surface layer such as, for example, a transistor or diode made by the planar method in which the lower side of an $SiO_2$ film has been provided beforehand is contaminated by the accumulation of various impurities and the existence of lattice disarrangement, surface cleansing can be accomplished simultaneously with surface passivation, and, accordingly, substantial improvement of electrical characteristics of the semiconductor device such as breakdown voltage and current amplification factor can be effected.

For the oxide of lead to be deposited on the semiconductor surface or the $SiO_2$ layer, oxides of lead other than PbO, such as $PbO_2$, $Pb_2O_3$, and $Pb_3O_4$ can be used. However, when $PbO_2$, $Pb_2O_3$, or $Pb_3O_4$ is used as a vapor source in the case of deposition by evaporation, the oxide is decomposed by the heating during evaporation, and most of the oxide at the time of deposition on the treated surface is PbO.

In addition to the evaporation technique of deposition, there are painting techniques. In this case also, the $PbO_2$, $Pb_2O_3$, or $Pb_3O_4$ decomposes during the heat treatment after painting and the resulting oxide in the form of PbO becomes a constituent of the glass-like substance. In this connection, $PbO_2$ begins to decompose at 290 degrees C., releases oxygen, and becomes $Pb_2O_3$. $Pb_2O_3$ begins to decompose at 330 degrees C., releases oxygen, and becomes $Pb_3O_4$. Then, $Pb_3O_4$ begins to decompose at 500 degrees C., releases oxygen, and becomes PbO. It is apparent, therefore, that during the formation of the glass film at a temperature of from 500 to 600 degrees C., $PbO_2$, $Pb_2O_3$, and $Pb_3O_4$ all decompose to PbO.

It is an object of the present invention to cover semiconductor surfaces, particularly exposed parts of pn junctions, with a glass-like film composed of oxides of silicon and lead in a manner to shield the semiconductor surface completely from the effects of moisture and impurities contained in the atmosphere, thereby to stabilize the semiconductor device, prolong its serviceable life, and increase its reliability.

Another object of the present invention is to produce on a semiconductor surface the above stated glass-like film with good reproducibility.

Still another object of the present invention is to produce a glass-like film of the above stated character in which no unreacted lead is remaining.

A further object of the invention is to form a protective insulating film on the surface of a semiconductor substrate at a temperature of a low value such as not to cause rediffusion of active impurities introduced previously into the semiconductor substrate.

Figure 1B:
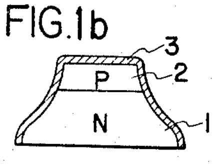
Figure 1C:
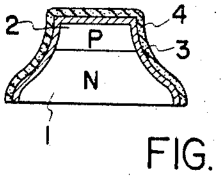
Figure 1D:
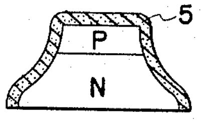
Figure 1E:
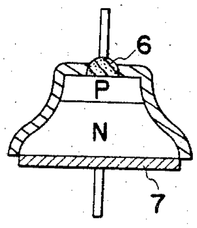

The nature, principle, and details of the invention will be more clearly apparent by reference to the following description with respect to preferred embodiments of the invention, when read in conjunction with the accompanying drawings in which like parts are designated by like reference characters, and in which:

FIGS. 1(*a*) to 1(*e*) consist of sectional views indicating progressive stages in the treatment process according to one embodiment of the invention as applied to the production of a diode; and FIGS. 1(*a*) to 1(*d*) similarly consist of sectional views indicating progressive treatment stages according to another embodiment of the invention as applied to the production of a diode.

EXAMPLE 1

Referring to FIG. 1(*a*), there is shown a mesa-type diode element made by a known method in which boron is caused to diffuse through one surface of an a-type silicon substrate of a resistivity of 100 ohm.cm. As shown, a p-type part 2 is formed by boron diffusion in an n-type substrate 1.

This diode element, with its surface maintained in a clean state, is placed in a furnace and treated for 30 minutes in an oxygen atmosphere at 700 degrees C. as tetraethoxysilane is decomposed by pyrolysis, whereupon, as indicated in FIG. 1(*b*), an $SiO_2$ film 3 of a thickness of approximately 6,000 angstroms is obtained over the entire surface of the diode element. In certain actual instances, the breakdown voltage of a diode element with a surface covered by only this $SiO_2$ film was in the range of from 400 to 500 volts.

Next, in a known vacuum evaporation deposition apparatus, PbO was deposited by vacuum evaporation on the surface of the $SiO_2$ film so formed by the preceding step. The thickness of this deposited PbO layer 4 as shown in FIG. 1(*c*) is approximately 1,000 angstroms. The diode element is then removed from the vacuum and is heat treated for approximately 15 minutes in an oxygen gas stream (flowing at a rate of 0.5 liter/min.) at a temperature of 650 degrees C., whereupon, as indicated in FIG. 1(*d*), a glass-like mixture film 5 consisting of a solid solution of lead monoxide PbO and silicon dioxide $SiO_2$ is formed on the surface of the diode. The PbO reacts with only the upper layer part of the $SiO_2$ layer 3 thereby to form the glass-like film at that part, and below the glass-like film, the $SiO_2$ layer remains as before. That is, the semiconductor surface by the above described treatment is covered by a 2,800-angstrom, lead glass film and, extending therebelow, a 4,900-angstrom, $SiO_2$ layer.

As mentioned previously, since the semiconductor surface in this example is not oxidized, the substrate semiconductor is not limited to silicon, and we have obtained excellent results in the case also of germanium. Furthermore, since the position of the semiconductor surface contacting the oxidized film does not shift in the treatment here exemplified, this treatment is advantageous for fabrication of miniature structures wherein impurities are diffused into a semiconductor to a micron-order depth to form a pn junction.

After the formation of the glass-like mixture film 5, its part where an electrode is to be formed is removed by using an aqueous solution of acidic ammonium fluoride, and gold is deposited at this part by evaporation to form an electrode 6 as shown in FIG. 1(*e*). In addition, the other electrode 7 is formed on the bottom part of the diode substrate 1 by a method such as nickel plating, whereupon the diode element is completed.

In actual instances, it was found that, by forming the glass film 5 on a diode element, the breakdown voltage of the diode element was raised to value of from 750 to 800 volts. It was further found that the results of tests wherein elements treated in the above described manner were left in an atmosphere of high temperature and high moisture (75 degrees C., 100 percent RH) were excellent, no drop whatsoever being observable in the breakdown voltage even after the elapse of 2,000 hours.

It should be mentioned here that, according to generally known phase diagrams, $SiO_2$ and PbO do not react at temperatures below approximately 710 degrees C., but in our experiments, it was found that a $SiO_2$/PbO, glass-like solid solution was formed from a temperature of approximately 500 degrees C. The reason for this apparent discrepancy appears to be that, in comparison with quantities of materials used for making these phase diagrams, the quantities involved in the present invention are extremely small, the quantity of the $SiO_2$ and PbO involved in the formation of the glass film being angstroms of several thousands in terms of layer thickness.

EXAMPLE 2

While in Example 1, description *a* is set forth with respect to an embodiment of the invention wherein reaction is caused between a part of a previously formed $SiO_2$ layer and a lead oxide layer to form a lead glass thin film, and the $SiO_2$ layer is caused to remain during the formation of the thin film, this example relates to a procedure wherein thorough reaction is caused between all of a previously deposited $SiO_2$ layer and lead oxide to form a lead glass-like mixture, and the semi-conductor surface is also somewhat oxidized.

Similarly as in Example 1, on the surface of a mesa type diode consisting of silicon as shown in FIG. 1(*a*), an $SiO_2$ layer 3 of 2,500-angstrom thickness is deposited as indicated in FIG. 1(*b*), and then a layer of PbO of 2,000-angstrom thickness is deposited on the layer 3 by evaporation. The resulting device is then heat treated for 30 minutes in a stream of oxygen gas at a temperature of 600 degrees C. It has been observed that by this treatment, all of the previously deposited $SiO_2$ reacts with the PbO to form a solid solution of PbO and $SiO_2$, and, moreover, the surface of the silicon surface is oxidized to the extent of approximately 300 angstroms.

Although it is possible to apply this method also to the case where the substrate is germanium, the film so produced is deficient in protective effect when compared with that obtained by the method of Example 1, and in an actual instance an increase in surface leakage voltage was observed. The reason for this is that in this case the substrate itself oxidizes, and germanium oxide is formed between the substrate surface and the glass film.

While in Examples 1 and 2 the pyrolytic decomposition of an organo-oxysilane is described as a method for preparing an $SiO_2$ covering film on the semiconductor substrate at a low temperature of an order such as not to give rise to rediffusion of the impurities, other methods can also be suitably applied to the practice of the present invention. Examples of such other methods are: the vacuum evaporation deposition technique; the method of electrical discharge decomposition of an organic compound of silicon; and the method of heat treating a silicon substrate in a water vapor atmosphere under a high pressure, for example, 700 atmospheres, at a temperature of approximately 600 degrees C. to cause the substrate to oxidize and thereby to form $SiO_2$.

In the case when only the outer surface part of the $SiO_2$ layer deposited by one of the above methods is to be vitrified by PbO, it is desirable that metallic substances such as simple silicon or SiO which readily drift or unstable oxides do not exist in the residual $SiO_2$ layer.

EXAMPLE 3

Figure 2A:
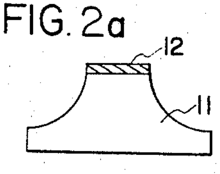
Figure 2B:
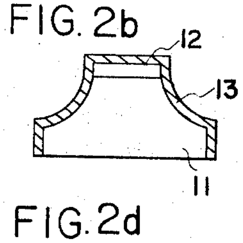
Figure 2C:
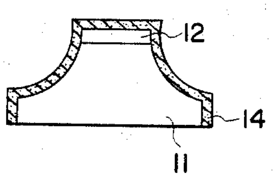
Figure 2D:
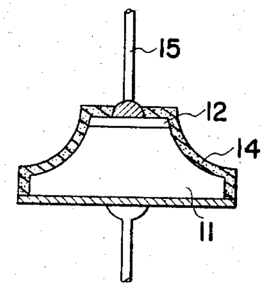

Referring to FIG 2(*a*), there are shown an n-type silicon substrate 11 of a resistivity of 100 ohm.cm. and a p-type region 12 formed thereon by diffusion of boron, a diode element being finished into one of mesa type as shown in FIG. 2(*a*) by a known photo-engraving method.

On this diode element, a PbO film 13 of 1,500-angstrom thickness as indicated in FIG. 2(*b*) is deposited by a known vacuum evaporation method in a vacuum of $1\times10^{-4}$ mm. Hg. Next, the element is maintained for 5 minutes at 700 degrees C. in a heat treatment furnace through which oxygen is flowing at a rate of 0.5 liter/min. and then cooled naturally in air to room temperature. As a result, the silicon of the silicon substrate surface over the entire element surface is oxidized to be transformed into $SiO_2$, and in an actual instance, a glass layer of 14 of 4,500-angstrom thickness consisting of a solid solution of this $SiO_2$ and PbO was formed as indicated in FIG. 2(*c*).

Then, through the use of an acidic ammonium fluoride solution and by a known photo-engraving method, a small opening for forming an electrode is made in the top surface of the element as indicated in FIG. 2(*d*), and through this opening a gold or aluminum electrode 15 is connected by evaporation deposition. After the bottom of the element has been nickel plated, a lead wire is connected thereto by soldering, whereupon the diode is completed.

In the evaporation deposition of the PbO, the control of the oxygen pressure within the vacuum chamber and the selection of the container (heater) in which the PbO is placed are extremely important for preventing decomposition reaction of the PbO. In actual instances of embodiments of the present invention, a platinum heater was used.

The thickness of the PbO film is, for example, from 1,500 to 2,000 angstroms. When this film is heated in a heat treatment furnace through which oxygen is flowing at a rate of 0.5 liter per minutes, reaction occurs at a temperature of 550 degrees C. or higher. In actual instances when films were so treated for 5 minutes each at 650, 700, and 800 degrees C., the thicknesses of the resulting glass layers consisting of a solid solution of PbO/$SiO_2$ were 3,500, 4,500, and 5,500 angstroms, respectively.

It was found that, if the heating time is 3 minutes or longer, this film thickness is a function of only the film thickness of the initially deposited lead oxide and the heating temperature and is unrelated to the heating time. As a result of our experiments in which the above described treatment was carried out on a silicon thin plate of 25 mm. diameter, it was observed that the same interference color was exhibited over the entire specimen surface, and there was very little deviation in the thickness of the glass film formed on the specimen surface.

Furthermore, the breakdown voltages of diodes treated by the method of the present invention undergo almost no change, and diodes according to the present example exhibited a mean breakdown voltage of 800 volts prior to and after treatment. It was further found that when samples of diode elements each as indicated in FIG. 2(*d*) were left standing for 1,000 hours in an atmosphere of 95-percent relative humidity at a temperature of 75 degree C., no deterioration whatsoever was observable in the breakdown voltage.

While by the method of this example, a glass layer consisting of a solid solution of $SiO_2$/PbO was formed in the case where the substrate was silicon, and excellent results were obtained, in the case of semiconductors such as germanium and others, comparably good results could not be obtained.

We have found that the present invention as described above with respect to a few examples thereof affords excellent results when applied to the surface passivation of mesa type transistors, planar type transistors, and semiconductor integrated circuits in addition to that of mesa type diodes. The effectiveness and utility of the method according to the present invention will be apparent from the following summary thereof.

(1) The covering film produced by the practice of the present invention is vitrified uniformly and evenly in at least its surface part and is highly effective in protecting semiconductor surfaces from moisture and impurities contained in the surrounding atmosphere, thereby improving the serviceable life and reliability of semiconductor elements.

(2) Since a glass film is formed at a relatively low temperature, rediffusion of impurities previously introduced into the semiconductor does not occur. Accordingly, shifting of pn junctions does not occur. Furthermore, accumulation or depletion of impurities in the semiconductor surface part contacting the film does not occur.

(3) The glass covering film formed according to this invention has very little effect causing the semiconductor surface which is in contact with the covering film, such as the $SiO_2$ film, to assume n-type conductivity.

(4) The process Pb→PbO is unnecessary. Therefore, there is no possibility of lead remaining in the unreacted state in the glass film.

(5) Since a relatively thin glass film of a thickness of 10,000 angstroms or less is obtained, there is little effect of strain due to the difference between the thermal expansion coefficients of the film and the semiconducter.

(6) As a result of the above features (1) through (5), reduction of the surface leakage current, reduction of noise, and increase in breakdown voltage can be expected.

(7) In the case when the present invention is applied to a transistor, its current amplification factor is improved, and, moreover, the steadiness of the current amplification factor with respect to the emitter current is improved.

(8) In the case wherein the semiconductor surface is to be covered by a double film of lead glass and $SiO_2$, the substrate need not be limited to silicon, said double film being applicable to other semiconductors such as germanium and intermetallic compound semiconductors.

(9) Since the semiconductor surface can be oxidized to form a glass covering film at a temperature at which rediffusion of impurities does not occur, it is possible to obtain, in effect, an etched state of the surface.

It should be understood, of course, that the foregoing disclosure relates to only preferred embodiments of the invention and that it is intended to cover all changes and modifications of the examples of the invention herein chosen for the purpose of the disclosure, which do not constitute departures from the spirit and scope of the invention as set forth in the appended claims.

What we claim is:

1. A method of fabricating semiconductor devices protected by an insulating covering comprising the steps of:

(a) depositing an oxide of lead on the surface of an element to be treated including a semiconductor substrate, from the vapor phase; and (b) subjecting said element to a heat treatment at a temperature which causes reaction between all of said oxide of lead and an oxide previously formed on said surface and constituting another principal component necessary for forming a glass covering by being mixed with said oxide of lead, thereby to form a glass-like covering on said surface.

2. A method for surface treatment of semiconductors comprising the process steps of:

(a) depositing a layer of an oxide of lead on the surface of a semiconductor substrate from the vapor phase; and (b) causing said substrate to oxidize in an oxidizing atmosphere and, at the same time, causing the resulting oxide of said substrate to react with all of said oxide of lead, thereby to form a glass-like covering on said surface of the substrate.

3. The method for surface treatment of semiconductors as claimed in claim 2, wherein the substrate semiconductor is silicon, and the oxide formed is silicon dioxide.

4. The method for surface treatment of semiconductors as claimed in claim 2, wherein the oxide of lead is lead monoxide.

5. A method for surface treatment of semiconductors comprising the process steps of:

(a) preparing a silicon dioxide layer on the surface of a semiconductor substrate;

(b) depositing a layer of an oxide of lead on said silicon dioxide layer from the vapor phase; and (c) subjecting said substrate to a heating treatment to cause said silicon dioxide to react with all of said oxide of lead and thereby to form a glass-like covering.

6. The method for surface treatment of semiconductors as claimed in claim 5, wherein the oxide of lead is lead monoxide.

7. A method for surface treatment of semiconductors comprising the process steps of:

(a) preparing a silicon dioxide layer on the surface of a semiconductor substrate;

(b) depositing a thin layer of an oxide of lead on said silicon dioxide layer from the vapor phase; and (c) subjecting said substrate to a heating treatment to cause only the surface part of said silicon dioxide layer to react with all of said oxide of lead and thereby to form a glass-like covering.

8. The method for surface treatment of semiconductors as claimed in claim 7, wherein said substrate semiconductor is silicon.

9. The method for surface treatment of semiconductors as claimed in claim 7, wherein said substrate semiconductor is germanium.

10. The method for surface treatment of semiconductors as claimed in claim 7, wherein said oxide of lead is lead monoxide.

11. A method for surface treatment of semiconductors comprising the process steps of:

(a) preparing a silicon dioxide layer on the surface of a semiconductor substrate;

(b) depositing a thick layer of an oxide of lead on said silicon dioxide layer from the vapor phase; and (c) subjecting said substrate to a heating treatment in an oxidizing atmosphere to cause all of said silicon dioxide to react with said oxide of lead and form a glass-like substance and, moreover, to cause said surface of the substrate semiconductor to undergo accelerated oxidation due to said oxide of lead and the resulting semiconductor oxide to react with said oxide of lead to form a glass-like substance, thereby to form a glass-like covering on the semiconductor surface.

12. The method for surface treatment of semiconductors as claimed in claim 11, wherein the substrate semiconductor is silicon.

13. The method for surface treatment of semiconductors as claimed in claim 11, wherein said oxide of lead is lead monoxide.

14. A method for surface treatment of semiconductors comprising the steps of:

(a) depositing a silicon dioxide layer on the surface of a semiconductor substrate by pyrolytic decomposition of an organo-oxysilane;

(b) depositing a layer of an oxide of lead on said silicon dioxide layer from the vapor phase; and (c) subjecting said substrate to a heat treatment to cause said silicon dioxide to react with all of said oxide of lead and thereby to form a glass-like covering consisting essentially of silicon dioxide and lead oxide.

15. A method for producing semiconductor elements having a semiconductor substrate of a first conductivity type and at least one semiconductive region formed by diffusing a second conductivity type determining impurity into said substrate which comprises:

depositing on the surface of said substrate a silicon oxide layer from the vapor phase at a temperature at which no rediffusion of said impurity occurs, to cover at least the end portion of the pn junction defined between said substrate of the first conductivity type and said diffused region of said second conductivity type;

depositing on the surface of said silicon oxide layer a lead oxide layer from the vapor phase;

heating the combination at a temperature at which substantially no rediffusion of said impurity occurs;

and causing all of the lead oxide to react with said silicon oxide, thereby to form a vitrified passivation film on the surface portion of the silicon oxide layer.

16. A method for producing a mesa-type semiconductor device which comprises the steps of:

preparing a semiconductor substrate of a first conductivity type;

forming a semiconductive region of a second conductivity type by diffusing a second conductivity type determining impurity into said substrate, thereby forming a pn junction between said substrate and said region;

selectively removing said region to expose said pn junction and said substrate under said region;

depositing a silicon oxide layer on the surfaces of said region and substrate by pyrolytic decomposition of an organo-oxysilane to cover said exposed pn junction with said silicon oxide layer;

depositing a lead oxide layer on said silicon oxide layer from the vapor phase;

heating the combination at a temperature at which substantially no rediffusion of said impurity occurs;

and causing all of said lead oxide to react with said silicon oxide, thereby to form a vitrified passivation film composed of silicon oxide and lead oxide on the surfaces of said region and substrate.

17. A method for producing a mesa-type semiconductor device which comprises the steps of:

preparing a silicon substrate of a first conductivity type;

forming a semiconductive region of a second conductivity type by diffusing a second conductivity type determining impurity into said substrate, thereby forming a pn junction between said substrate and said said region;

selectively removing said region to expose said pn junction and said substrate under said region; depositing a lead oxide layer on the surfaces of said region and substrate from vapor phase;

and heating the combination in an oxidizing atmosphere at a temperature at which the position of said pn junction does not substantially move, thereby to form a glass-like passivation film composed of silicon oxide and lead oxide on the surfaces of said region and silicon substrate.

References Cited

UNITED STATES PATENTS

| | | | |
|---|---|---|---|
| 3,300,339 | 1/1967 | Perri et al. | 117—201 |
| 3,301,706 | 1/1967 | Flaschen et al. | 117—217 |
| 3,313,661 | 4/1967 | Blake | 117—200 X |

WILLIAM L. JARVIS, *Primary Examiner.*